(12) United States Patent
Krishnamoorthy

(10) Patent No.: US 6,977,950 B1
(45) Date of Patent: Dec. 20, 2005

(54) POWER DISTRIBUTION NETWORK FOR OPTOELECTRONIC CIRCUITS

(75) Inventor: Ashok V. Krishnamoorthy, Middletown, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/450,054

(22) Filed: Nov. 29, 1999

(51) Int. Cl.[7] .............................. H01S 3/00; H01S 3/13
(52) U.S. Cl. ...................................... 372/38.04; 372/32
(58) Field of Search ................... 372/38.04, 29.012, 372/50, 109, 45, 38.1–38.07, 32; 257/99, 257/207, 775, 778; 385/14; 716/2; 333/125, 333/136; 343/700 MS, 853

(56) References Cited

U.S. PATENT DOCUMENTS

| | | | | |
|---|---|---|---|---|
| 5,132,648 | A * | 7/1992 | Trinh et al. | 333/136 |
| 5,266,794 | A * | 11/1993 | Olbright et al. | 250/214 LS |
| 5,309,001 | A * | 5/1994 | Watanabe et al. | 257/778 |
| 5,337,397 | A * | 8/1994 | Lebby et al. | 385/33 |
| 5,351,256 | A * | 9/1994 | Schneider et al. | 372/45 |
| 5,416,861 | A * | 5/1995 | Koh et al. | 385/14 |
| 5,889,903 | A * | 3/1999 | Rao | 385/14 |
| 6,037,822 | A * | 3/2000 | Rao et al. | 327/298 |
| 6,125,217 | A * | 9/2000 | Paniccia et al. | 385/14 |
| 6,230,300 | B1 * | 5/2001 | Takano | 716/2 |
| 6,316,981 | B1 * | 11/2001 | Rao et al. | 327/298 |
| 6,400,129 | B1 * | 6/2002 | Yamaguchi et al. | 324/76.82 |
| 6,448,168 | B1 * | 9/2002 | Rao et al. | 438/598 |

OTHER PUBLICATIONS

A.L. Fisher et al, "Synchronizing Large VLSI Processor Arrays", IEEE Trans. Comp., vol. C-34, No. 8, pp. 734-740 (Aug. 1985).

A. V. Krishnamoorthy et al, "Vertical-Cavity Surface Emitting Lasers Flip-Chip Bonded to Gigabit/s CMOS Circuits", IEEE Photonics Technology Letters, vol. 11, No. 1, Jan. 1999.

\* cited by examiner

*Primary Examiner*—Minsun Oh Harvey
*Assistant Examiner*—Philip Nguyen

(57) ABSTRACT

Method and arrangement are disclosed for a power distribution network for distributing power to VCSELS on an optoelectronic chip that maintains a constant bias voltage to the VCSELs. More particularly, the power distribution network includes an H-tree network for directing a power signal. The H-tree network includes a primary input for receiving the power signal and at least one level, with terminal nodes coupled to the last level, and each level includes a plurality of segments. Each segment of a respective level is equal in length and the total number of segments from the primary input to each terminal node is the same. Since the distance from the primary input to each terminal node is equal, greater bias voltage uniformity is provided to the terminal nodes. A similar distribution network is used for the ground connection.

11 Claims, 4 Drawing Sheets

POWER DISTRIBUTION NETWORK FOR OPTOELECTRONIC CIRCUITS

FIELD OF THE INVENTION

This invention relates generally to a power distribution network for optoelectronic circuits and more particularly, to a power distribution tree network for optoelectronic devices, such as vertical cavity surface emitting lasers (VCSELs).

BACKGROUND OF THE INVENTION

Vertical Cavity Surface Emitting Lasers have been widely used in a variety of commercial products, including optical disc players and laser printers. Furthermore, because VCSELs have lasing cavities that are perpendicular to the optical surface of a laser chip, they can have a high packing density. Therefore VCSELs have a promising future in high density laser arrays and optical communication systems characterized by high data transmission rates and/or high parallel processing speeds as well as a technology well-suited to provide fast and high capacity data transmission between individual electronic chips.

It is expected that the ability to directly integrate VCSELs onto CMOS Optoelectronic-VLSI (OE-VLSI) chips can significantly reduce the cost of deploying OE-VLSI technologies in high-performance systems.

OE-VLSI technology provides close integration of optical devices with VLSI electronics. The goal is to supply multiple high-performance optical input and output signals, with aggregate data-rates up to, and even exceeding, a terabit-per-second to state-of-the-art VLSI circuits. Such technology allows a significant increase in integration density over all-electrical systems because the functionality present in many separate electronic chips can be condensed into fewer chips (and in some cases a single chip) with large numbers of optical inputs and/or outputs (I/Os).

Although VCSELs have recently been integrated into gigabit-per-second CMOS OE-VLSI chips (see, for example, an article entitled "Vertical-cavity surface emitting lasers flip-chip bonded to gigabit/s CMOS circuits," written by A. V. Krishnamoorthy et al., published in *IEEE Photonics Technology Letters*, Vol. 11, No. 1, January 1999.), many challenges remain before VCSEL-based OE-VLSI circuits can be reliably operated. In particular, the problem of imprecise bias voltage across an OE-VLSI chip must be resolved, which results in VCSEL output power variations. Specifically, when a VCSEL is biased above a threshold, a small difference in bias voltage between two identical VCSELs in different locations of an array of VCSELs on an OE-VLSI chip can result in a large difference in light output power. Therefore, there is a clear and present need for an effective means of maintaining a constant bias voltage across each VCSEL on an OE-VLSI chip.

SUMMARY OF THE INVENTION

The problem of maintaining a constant bias voltage associated with distributing a power signal to optoelectronic devices in an optoelectronic circuit is reduced or overcome by a power distribution network in accordance with the principles of the invention. The power distribution network includes electrically conductive pathways that form at least one level, where each level includes a plurality of equal-length conductive segments (hereinafter referred to as "segments"), a means for coupling the power signal from a primary input to a point at the center of a first level, terminal nodes coupled at the extremities of a last level for supplying the power signal to devices that form at least a portion of the optoelectronic circuit, and wherein the number of segments connecting the primary input to each of said terminal nodes is equal. Since the length of the conductive pathways from the primary input to each terminal node is equal, greater bias voltage uniformity is provided to the terminal nodes. A similar distribution network is used for the ground connection.

In one illustrative embodiment, the power distribution network for optoelectronic circuits includes electrical conductive pathways that form an H-tree network that distributes a power signal to a plurality of terminal nodes (leaf nodes), for example, VCSELs on an optoelectronic chip. The H-tree network includes a primary input for receiving a power signal and conductive pathways that are arranged to form a plurality of levels, wherein portions of said conductive pathways are interconnected. Each level has a plurality of segments (branches) that forms at least one Arabic letter "H"-shaped pattern (hereinafter known as "H pattern"). Each H pattern includes six equal length segments, with two segments in each of two parallel portions and two segments connected perpendicular at the midpoints of the parallel portions to form the H pattern). The pluralities of segments are laid out in a hierarchical succession of H patterns to form the various levels of the H-tree network. The first level is coupled to the primary input, at the midpoint of the two perpendicular segments of the H pattern. A new level of the H-tree is formed by coupling the center of the two perpendicular segments of the new level H patterns to the end points of the preceding level H patterns of the H-tree. Terminal nodes are coupled to the end points of the last level of the H-tree. In this manner a conductive pathway is formed from the primary input to each terminal node, with portions of each conductive pathway interconnected with one or more other conductive pathways. Since the length of each segment is equal for a respective level, the length of the conductive pathway from the primary input to each terminal node is the same.

In operation, the power distribution tree network utilizes the equal lengths of the conductive pathways of the H-tree network to provide greater bias voltage uniformity to the terminal nodes by eliminating small differences in bias voltage to terminal nodes in different locations of the optoelectronic circuit. The differences in bias voltage result from resistive voltage drops along a conventional linear power supply line. Although, bias voltage uniformity at each terminal node is improved, the current consumption of other terminal nodes may affect the overall bias voltage stability (due to the shared conductive pathways).

In another illustrative embodiment, the power distribution network includes an H-tree network, which is configured in an H-tree geometrical pattern that ensures that the absolute voltage at each terminal node is not affected by the current consumption of other terminal nodes in the optoelectronic circuit. The H-tree geometrical pattern is similar to the embodiment described above except that each terminal node has a separate conductive pathway associated with it. Specifically, the conductive pathways from the primary input to each terminal node are not shared for any portion of the pathway. Each conductive pathway is equal in total length but is joined to other conductive pathways only at a common point.

BRIEF DESCRIPTION OF THE DRAWING

The invention will be more readily understood after reading the following detailed description taken in conjunction with the accompanying drawing, in which.

DETAILED DESCRIPTION

The present invention is an arrangement for distributing power to optoelectronic devices on an optoelectronic circuit, for example, an array of VCSELs integrated into a VLSI chip, using a novel power distribution tree network. The tree network utilizes equal lengths of conductive pathways to each optoelectronic device to distribute power. The tree network eliminates small differences in bias voltage to the optoelectronic devices in different locations on the optoelectronic circuit resulting from resistive voltage drops along a conventional linear power supply line.

In a typical VLSI chip, the power distribution network is a power-ground supply line or power bus, which is used to power many different circuit components by the same power bus. The power bus is generally two parallel power-ground conductive pathways (e.g., wires), fabricated from a conductive material. The conductive material, typically metal, has an innate resistance. As will be understood by persons skilled in the art, the resistance of a wire is inversely proportional to its thickness and is typically characterized as ohms per square. This resistance results in a finite voltage drop along the wire when it is carrying current. For example, aluminum power supply lines have a resistance on the order of 0.05 ohms per square. Thus, for example, if a circuit element consumes 10 mA, then the voltage-drop on the aluminum power supply line with a resistance of 0.05 ohms per square and 50 squares in length is 25 mV. If the same power supply line powers many such elements, the current, and hence the voltage drop proportionately increases.

Although voltage-drops are not typically an issue for digital circuits or for low-current analog circuits, they can have a dramatic effect on the output power of optoelectronic devices and, in particular, VCSELs. We note that maintaining precise bias voltage across a chip is typically not an issue with digital circuits because these circuits are designed to be resistant to fluctuations in the power supply. However, as will be understood by persons skilled in the art, a VCSEL, for example, has a very sharp dependence on the voltage across the device due to the so-called sharp light (output power)-versus-current characteristic of such devices. In particular, the combination of large current requirements for VCSELs and finite resistance of the power supply lines can lead to small power supply differences (e.g. bias voltages) to VCSELs in different parts of the array that result in the large differences in light output power.

Figure 1:
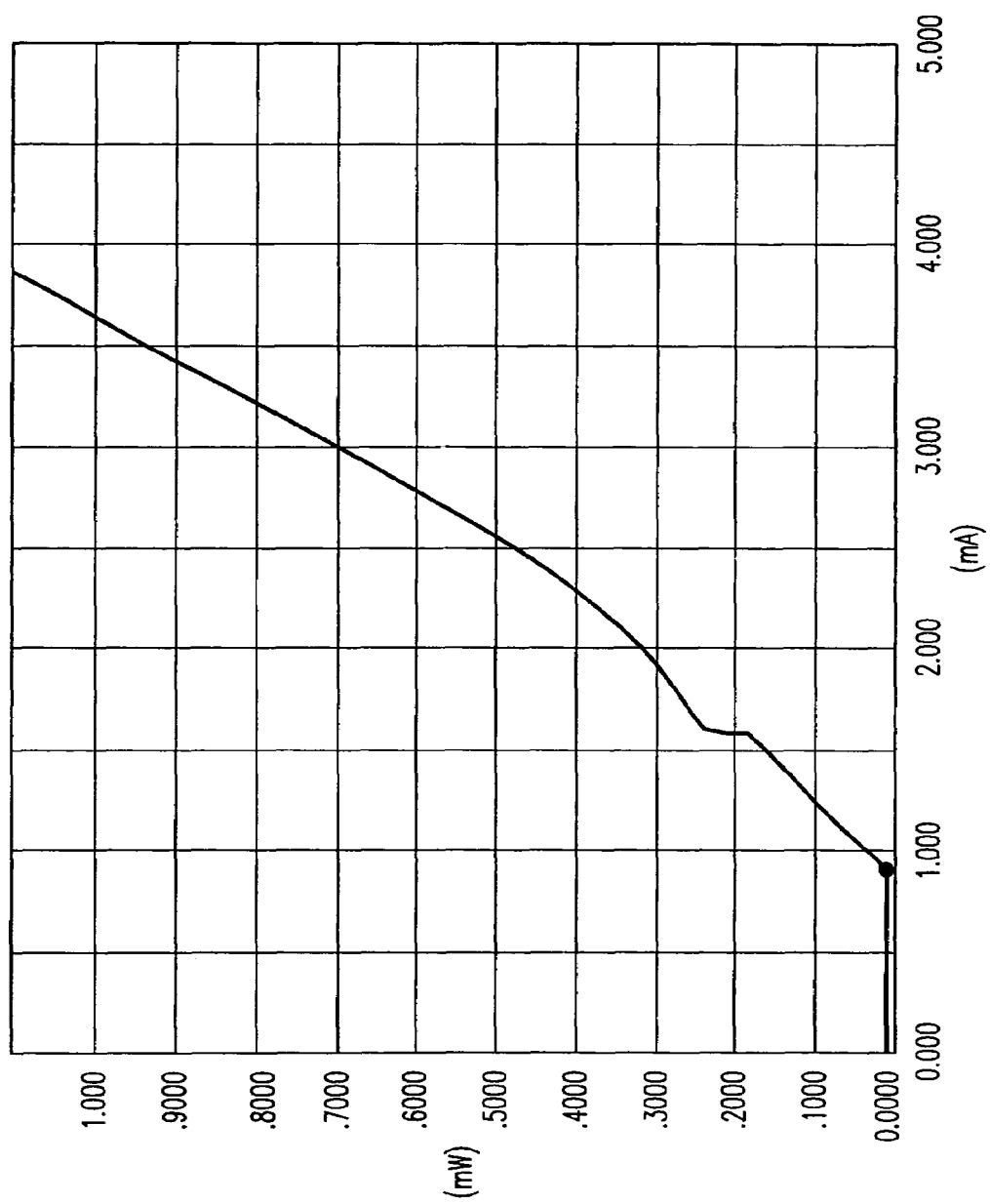
FIG. 1 is a graph of the output power of a VCSEL bonded to an OE-VLSI chip plotted as a function of input current.
Figure 2:
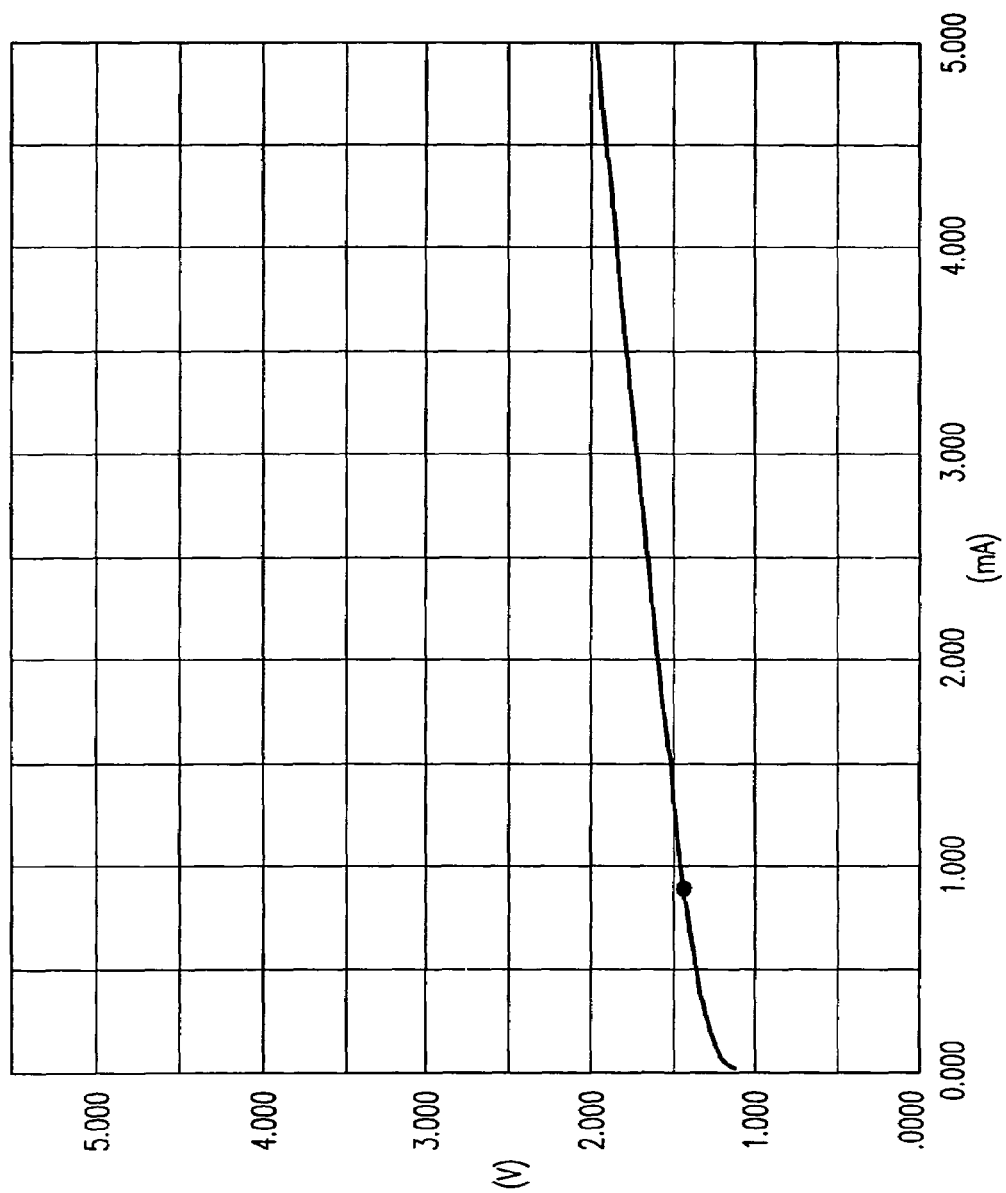
FIG. 2 is a graph of the current-to-voltage relationship of the VCSEL of FIG. 1.

The graph of FIG. 1 plots the output power (in milli-watts) of a VCSEL bonded to an OE-VLSI chip as a function of input current (in milli-amps). As shown in FIG. 1 a small change in input current leads to a large change in output power. The graph of FIG. 2 plots the current-to-voltage relationship of the VCSEL of FIG. 1. Accordingly, when a VCSEL is biased above threshold (in this case 0.9 mA and 1.43V, represented by respective dots 10 and 20 in FIGS. 1 and 2), a large change in output power results from a small change in applied voltage or current.

Thus, to maintain a constant level of output power for each VCSEL in an array of VCSELs on an OE-VLSI chip it is particularly important to ensure (1) that the threshold currents and voltages of each VCSEL are identical (an OE-VLSI chip fabrication issue) and (2) that each VCSEL in an array is biased identically (a circuit design issue). The latter, in turn, relies on maintaining a constant voltage and current bias across the VCSELs.

Figure 3:
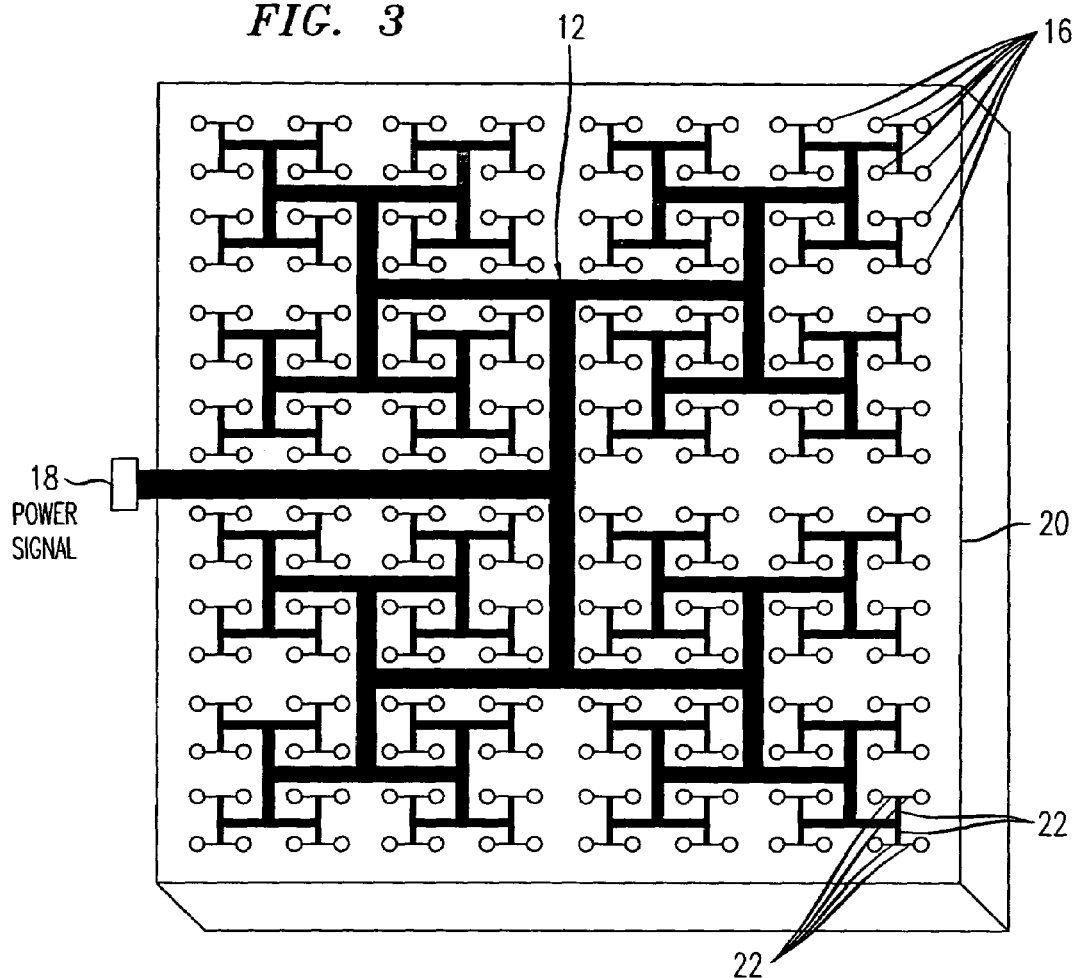
FIG. 3 is a schematic diagram of one illustrative embodiment of a power distribution network in accordance with the principles of the present invention.

FIG. 3 is a schematic diagram of one embodiment of a power distribution network in accordance with the principals of the present invention. The power distribution network includes an H-tree network 12, represented by the interconnected conductive pathways in the Arabic letter "H" patterns, for distributing a power signal received from a primary input 18, wherein the conductive pathways are arranged to form a plurality of levels. For example, a four-level H-tree is shown in FIG. 3, with level one represented by the one large "H", level two represented by the next largest four "H's" and so on. The first level is coupled to the primary input, at the center of the two horizontal segments of the H pattern. The conductive pathways distribute a power signal to terminal nodes 16 (represented by circles and as further indicated in the upper right hand quadrant for a portion of the terminal nodes of FIG. 3) on VLSI chip 20, wherein the distance from the primary input to each terminal node 16 is equal. In this illustrative example, each terminal node 16 represents a VCSEL and its associated driver.

Each level of H-tree network 12 includes pluralities of conductive segments (branches) 22. Each segment 22 is represented by the individual portions of each "H" pattern and as further indicated in the lower right hand quadrant for a portion of one plurality of segments of one level of the H-tree network of FIG. 3. Each "H" pattern includes six equal length segments, with two segments in each of two parallel portions and two segments connected perpendicular at the midpoints of the parallel portions to form the H pattern. The pluralities of segments 22 are laid out in a hierarchical succession of H patterns to form the various levels of the H-tree network 12. Each level includes at least one H pattern.

A first level is coupled to the primary input, at the midpoint of the two perpendicular segments of the H pattern. A new level of the H-tree is formed by coupling the midpoint of the two perpendicular segments of the new level H patterns to the end points of the preceding level H patterns of the H-tree. Terminal nodes are coupled to the end points of the last level of the H-tree. In this manner a conductive pathway is formed from the primary input to each terminal node, with portions of each conductive pathway being shared between two or more terminal nodes. Since the length of each segment is equal for a respective level and the total number of segments to each terminal node is also equal, the length of the conductive pathway from the primary input to each terminal node is the same. A similar distribution network is used for the ground connection (not shown).

Although the classical H-tree interconnected conductive pathway configuration is commonly used for equidistant electrical clock distribution in multiple CPU designs on single a VLSI chip, it has not been exploited as a power distribution method. Such prior art H-tree configurations used the equal conductive pathway lengths of the H-tree branches to minimize timing skew in the arrival of clock pulses to various elements of the H-trees in high-speed clock distribution circuits. For example, see an article entitled Fisher and Kung, "Synchronizing Large VLSI Processor Arrays," published in *IEEE Trans. Comp.*, Vol. C-34, No. 8, pp. 734–740 (August 1985), by A. L. Fisher et. al., which investigated clock skew in large two-dimensional arrays clocked by an "H-tree" network. In contrast to the prior art, an H-tree interconnected conductive pathway configuration is used for powering optoelectronic devices, such as VCSELs, on an OE-VLSI chip.

In operation of the present invention, the effect of voltage drops due to power supply line resistance are reduced when DC power is distributed to the terminal nodes of on optoelectronic circuit, namely the VCSELs in an array of VCSELs of an OE-VLSI chip, with the H-tree power distribution network. Since the lengths of the conductive pathways to each terminal node are equal, there is greater uniformity of the voltage and current provided to each terminal node.

Advantageously, when the current draw of the array of VCSELs on an OE-VLSI chip is so-called "balanced" (by balanced we mean that there is geometrical symmetry with respect to the VCSELs that are "on" or drawing current), the VCSELs in an array are biased identically. Specifically, the precise bias voltage seen by a specific VCSEL (terminal node) is dependent on the total current flowing into the specific segments (due to potential voltage drops along the various segments). This current, in turn, depends on the current consumption of the immediate neighbors of the specific VCSEL. For example, when a greater number of VCSELs are "on" in one location of the array (for example, the VCSELs in the upper left hand quadrant of FIG. 3), more current is drawn in those segments of H-tree network 12. In turn, those segments have a higher voltage (due to Ohms law), and thus the associated VCSELs have a higher bias voltage than those in the other quadrants of FIG. 3.

Therefore, when there is a geometrical symmetry with respect to the VCSELs that are "on" and those that are "off" on an OE-VLSI chip, the current draw is the same and any voltage drop in the power lines is common to all of the VCSELs. Accordingly, the bias voltage to all of the "on" VCSELs is the same and the OE-VLSI chip is balanced. One example of a balanced OE-VLSI chip is when all of the VCSELs are "on". However, typically VCSEL operation on an OE-VLSI chip is not balanced, therefore, it is not guaranteed that all of the VCSELs will receive the same bias voltage.

Figure 4:
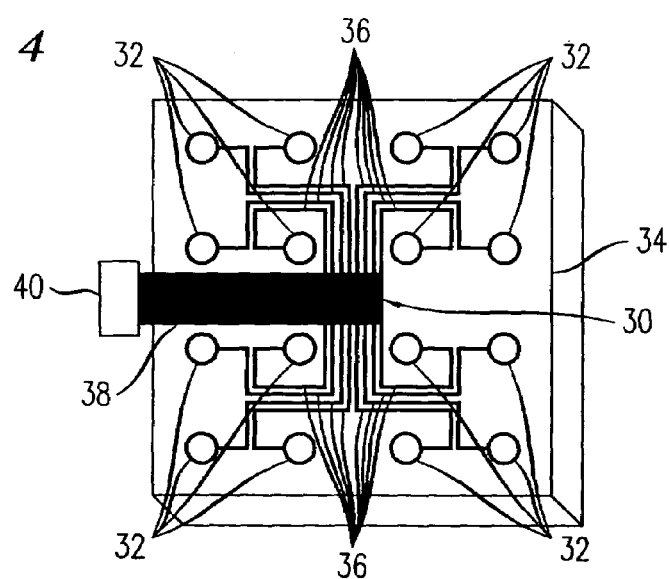
FIG. 4 is a schematic diagram of another embodiment of the power distribution network in accordance with the principles of the present invention.

FIG. 4 depicts another illustrative embodiment in which the power distribution network is configured in an H-tree geometrical pattern ensuring that the absolute voltage at each terminal node is not affected by the current consumption of other terminal nodes on the H-tree network. FIG. 4 shows a two level H-tree power distribution network 30 that distributes power to a 4×4 array of terminal nodes 32 on VLSI chip 34, of course, other level and array configurations are possible. Each terminal node 32 has a separate plurality of conductive segments 36 that forms a separate conductive pathway associated with a particular terminal node, and each conductive pathway conforms to a classical H-tree geometrical pattern, as described above. Although the conductive pathways are all equal in total length (e.g., the sum of all segments to a particular terminal node), the conductive pathways for each terminal node are not completely interconnected. In contrast with a classical H-tree configuration, the power supply lines are joined only at a common point 38 (root). The common point 38 is coupled to primary power supply input 40, for example, a power supply pad on the perimeter of the VLSI chip. The ground distribution network is in a similar configuration (not shown).

Since the current draw will occur at the common point and all of the conductive pathways are equal in length, any voltage drop will be the same for all the terminal nodes. Thus, all of the terminal nodes on the optoelectronic chip will have the same bias voltage. In this manner, the current load or draw for one terminal node does not affect the bias voltage of other terminal nodes. As a result, this H-tree power distribution network ensures that any voltage drop on the power-distribution conductive pathways is the same for all the terminal nodes, and each terminal node on the H-tree experiences the same bias voltage independent of the total current flowing on the conductive pathways.

Figure 5:
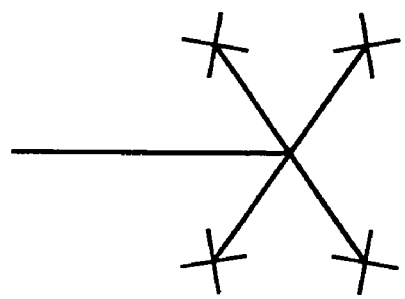
FIGS. 5 and 6 are diagrams of other geometrical patterns for a tree network that can be used with a power distribution network in accordance with the principles of the present invention.
Figure 6:
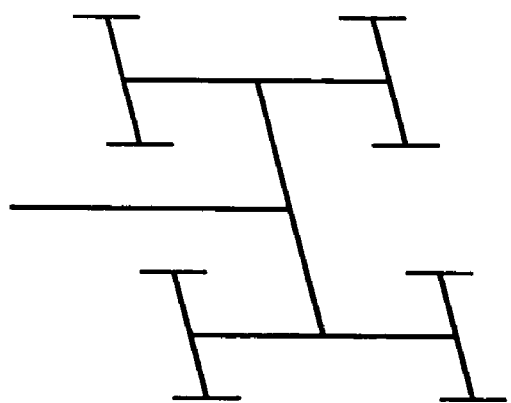

Although the present invention has been described in accordance with the embodiments shown, one of ordinary skill in the art will readily recognized that there could be variations to the embodiments shown and those variations would be within the spirit and scope of the present invention. For example, FIGS. 5 and 6 show two other tree patterns for a power distribution network in accordance with the principals of the present invention. FIG. 5 shows an X-shaped tree pattern and FIG. 6 shows a skewed H-tree pattern (of course, portions of the conductive pathways of a tree network utilizing these patterns may or may not be shared analogous to the embodiments of FIGS. 3 and 4). Moreover, a hybrid combination of any of the patterns shown in FIGS. 3 through 6 may be used as a tree network to deliver power to optoelectronic circuits. Accordingly, many modifications may be made by one of ordinary skill in the art without departing from the spirit and scope of the appended claims.

What is claimed is:

1. A network for distributing a power signal in an optoelectronic circuit, said network comprising:
    a plurality of electrically conductive pathways forming at least a first level wherein each level is comprised of a plurality of segments linearly extending from a common point, each of the segments of respective levels having equal lengths, and wherein the segments of a next order higher level are formed at the extremities of a previous order lower level, the extremities of the previous order lower level functioning as the common point for the formation of the next order higher level;
    means for coupling said power signal from a primary input to the common point of the first level; and
    terminal nodes coupled at the extremities of a last level for supplying said power signal to a plurality of optical signal generating devices that form at least a portion of said optoelectronic circuit, wherein the number of segments connecting said primary input to each of said terminal nodes is equal such that the power supplied by the terminal nodes to each of the plurality of optical signal generating devices is substantially equal.

2. The network of claim 1 wherein each level is at least one H-shaped pattern comprising first and second parallel branches each having a respective first and second midpoint, and a third branch interconnecting said first and second midpoints, and wherein said center of said H-shaped pattern is the midpoint of said third branch.

3. The network of claim 1 wherein each level is at least one X-shaped pattern comprising first and second branches each having a respective first and second midpoint and interconnecting said first and second branches at said midpoints, and wherein said center of said X-shaped pattern is the intersection of said first and second branches.

4. The network of claim 1 wherein said network is located on an optoelectronic chip.

5. The network of claim 1 wherein said terminal nodes are optoelectronic devices.

6. The network of claim 1 wherein said terminal nodes are VCSELS.

7. A network for distributing a power signal in an optoelectronic circuit, said network comprising:

a plurality of separate electrically conductive pathways forming at least a first level, wherein each level is comprised of a plurality of segments linearly extending from a common point, each of the segments of respective levels having equal lengths and wherein said pathways are joined only at the extremities of a previous order lower level, the extremities of the previous order lower level functioning as the common point;

means for coupling said power signal from a primary input to the common point of the first level;

terminal nodes coupled at the extremities of a last level for supplying said power signal to a plurality of optical signal generating devices that form at least a portion of said optoelectronic circuit, wherein the number of segments connecting said primary input to each of said terminal nodes is equal such that the power supplied by the terminal nodes to each of the plurality of optical signal generating devices is substantially equal.

8. The network of claim 7 wherein each level is at least one H-shaped pattern comprising first and second parallel branches each having a respective first and second midpoint, and a third branch interconnecting said first and second midpoints, and wherein said center of said H-shaped pattern is the midpoint of said third branch.

9. The network of claim 7 wherein each level is at least one X-shaped pattern comprising first and second branches each having a respective first and second midpoint and interconnecting said first and second branches at said midpoints, and wherein said center of said X-shaped pattern is the intersection of said first and second branches.

10. A method of distributing a power signal to a plurality of terminal nodes on an optoelectronic circuit, the method comprising the steps of:

receiving the power signal from a primary input; and directing said power signal to said plurality of terminal nodes using an H-tree network, said H-tree network including at least a first level, wherein the first level is coupled to said primary input, and a last level includes said plurality of terminal nodes for supplying said power signal to a plurality of optical signal generating devices, each of said at least one level having a plurality of segments, each segment of a respective plurality is equal in length; and wherein a number of segments from said primary input to each of said terminal nodes is equal such that the power supplied by each of the terminal nodes to each of the plurality of optical signal generating devices is substantially equal.

11. The method of claim 10, wherein the directing step further includes directing said power signal to said plurality of terminal nodes using an H-tree network, wherein said plurality of segments are configured into at least one H pattern to form said at least first level; and wherein said at least first level is configured into a hierarchical succession of H patterns.

* * * * *